United States Patent

Nakaguro et al.

[19]

[11] Patent Number: 6,119,064
[45] Date of Patent: Sep. 12, 2000

[54] VEHICULAR CONTROL APPARATUS ARRANGED FOR UNDERGOING INITIAL FAILURE TEST AFTER BURN-IN AND METHOD ARRANGED THEREFOR

[75] Inventors: Kunio Nakaguro; Takashi Kimura, both of Kanagawa, Japan

[73] Assignee: Nissan Motor Co., Ltd., Kanagawa, Japan

[21] Appl. No.: 08/980,428

[22] Filed: Nov. 28, 1997

Related U.S. Application Data

[63] Continuation of application No. 08/857,567, May 15, 1997, abandoned.

[51] Int. Cl.[7] .................................................. G01M 15/00
[52] U.S. Cl. .......................................... 701/115; 73/118.1
[58] Field of Search ..................................... 701/114, 115, 701/29, 31; 73/116, 117.2, 117.3, 118.1

[56] References Cited

U.S. PATENT DOCUMENTS

| | | | |
|---|---|---|---|
| 5,095,438 | 3/1992 | Sasaki | 701/115 |
| 5,247,446 | 9/1993 | Motz et al. | 701/115 |
| 5,293,317 | 3/1994 | Adrain et al. | 701/115 |
| 5,497,330 | 3/1996 | Ishida | 701/115 |
| 5,526,267 | 6/1996 | Sogawa | 701/115 |
| 5,602,738 | 2/1997 | Sasaki | 701/115 |
| 5,787,381 | 7/1998 | Sasaki | 701/115 |
| 5,802,485 | 9/1998 | Koelle et al. | 701/115 |
| 5,884,211 | 3/1999 | Pauli et al. | 701/115 |

FOREIGN PATENT DOCUMENTS 7-287603 10/1995 Japan .

*Primary Examiner*—George Dombroske
*Attorney, Agent, or Firm*—McDermott, Will & Emery

[57] ABSTRACT

In a vehicular control apparatus having a bare-chip mounting type vehicular electronic unit and an associated vehicular actuator, a predetermined higher bias voltage (approximately 7 volts higher than a normal bias voltage of approximately 5 volts) is supplied to a micro controller of the electronic unit so as to impose a high stress on the micro controller under a burn-in condition such that the micro controller is exposed to a burn-in high temperature for a burn-in time duration. After the above-described burn-in process, an external initial failure testing purpose program is transmitted to a serial communication circuit of the micro controller so that the micro controller executes instructions of the external initial failure testing purpose program to evaluate an operation of the micro controller to determine whether an initial failure in the micro controller occurs.

16 Claims, 9 Drawing Sheets

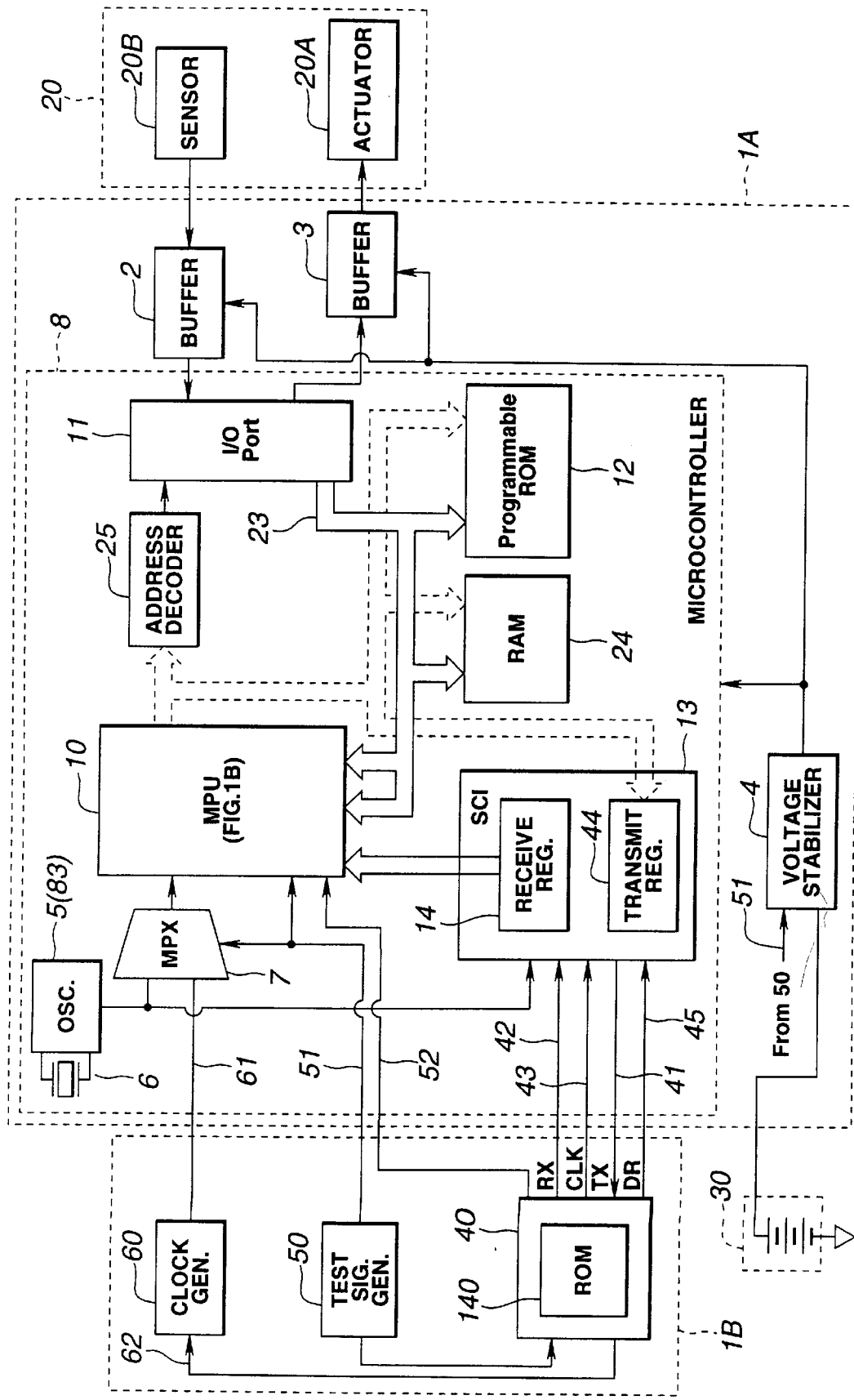

VEHICULAR CONTROL APPARATUS ARRANGED FOR UNDERGOING INITIAL FAILURE TEST AFTER BURN-IN AND METHOD ARRANGED THEREFOR

This application is a continuation application of Ser. No. 08/857,567 filed May 16, 1997 now abandoned from which this application claims priority.

BACKGROUND OF THE INVENTION

The present invention relates to a vehicular control apparatus arranged for undergoing an initial failure test after a burn-in and a method arranged therefor.

The present invention, more particularly, relates to the vehicular control apparatus having a bare-chip formed micro controller (microcomputer) mounted on a printed circuit board and arranged for undergoing the initial failure test using an external initial failure testing purpose program after the burn-in of the micro controller and the method arranged therefor before a shipment of the electronic unit which is to be mounted in a vehicle. The present invention is applicable to a combination of the vehicular control apparatus with an initial failure testing apparatus external to the vehicular control apparatus.

A Japanese Patent Application First Publication No. Heisei 7-287603 published on Oct. 31, 1995 exemplifies a previously proposed vehicular engine control apparatus arranged for undergoing an initial failure test.

In the previously proposed vehicular engine control apparatus disclosed in the above-identified Japanese Patent Application Publication, the burn-in of the microcomputers carried out and thereafter the initial failure test is carried out to detect an initial failure of the engine control unit having the micro computer before a shipment of the engine control unit, with the microcomputer of the engine control unit actually mounted on a printed circuit board and with an output voltage of a voltage stabilizer in the engine control unit boosted to a voltage higher than a normal voltage on the basis of which the engine control unit is operated in order to impose a high stress on the engine control unit at a higher temperature.

The previously proposed vehicular engine control apparatus disclosed in the above-identified Japanese Patent Application Publication has an object to undergo the burn-in and initial failure test for the vehicular engine control apparatus after a nonvolatile ROM (for example, EEP (Electrically Erasable Programmable) ROM) incorporated into the microcomputer of the engine control unit has actually mounted on the printed circuit board (on-board test). Hence, the burn-in and thereafter initial failure test for electronic parts such as a control circuit portion of the microcomputer, an input processor, an output processor, and the electronic parts except the microcomputer are carried out before they are mounted on the printed circuit board.

In the previously proposed vehicular engine control apparatus disclosed in the above-identified Japanese Patent Application Publication, controls for the individual electronic parts on the pc (printed circuit) board including the microcomputer itself have been carried out in accordance with a program stored in the nonvolatile ROM incorporated in the microcomputer.

However, an electronic control unit has recently been developed in which a bare chip formed semiconductor device mounting technique has been adopted. This bare chip mounting technique is such that a semiconductor chip of a packageless type (i.e., no package is used) is directly die bonded (die bonding method) on the pc board and, thereafter, a wire bonding method is carried out for the semiconductor chip.

It is a general practice that an inspection for the semiconductor chip is carried out when a wafer is finished or when the package is mounted on the chip. In addition, the burn-in is often carried out in order to make a screening for every vehicle applied semiconductor device before the inspection for the package to be mounted on the semiconductor chip is carried out.

It is also a general practice that in the burn-in for the semiconductor device is carried out at a higher temperature (a burn-in temperature), with a high voltage application (burn-in voltage), and for a predetermined period of time (a burn-in time duration) so as to impose a high stress on the microcomputer before the initial failure test.

The initial failure test for the electronic control unit in which the bare chip mounting technique has been adopted is carried out to examine a wire connection condition in the control unit on the pc board after the chip is mounted on the pc board and to examine electrical characteristic values such as to be determined according to the result of the initial failure test which can naturally be carried out with the semiconductor chip being actually mounted on the pc board.

In details, it is necessary to perform the initial failure test after the semiconductor chip has been mounted on the pc board.

However, when the semiconductor chip is actually mounted on the pc board in a form of the bare-chip mount, terminals (pads) of the semiconductor chip are connected to the other electronic parts on the same pc board. Hence, it is, in turn, difficult to bring a terminal (probe) of an external tester into a direct contact on an input/output terminal of the bare-chip formed microcomputer and to connect an external memory in which a testing purpose program is stored to the bare-chip formed microcomputer on the pc board in the ways as could easily be carried out in the case of the packaged microcomputer in order to confirm an operation of the bare-chip formed microcomputer.

In order to operate the microcomputer after the corresponding semiconductor chip is mounted on the pc board in the bare chip mounting form, a special-purpose program exclusively used for the initial failure test and the burn-in is needed to be stored in the nonvolatile ROM in addition to the control program usually stored in the nonvolatile ROM to be run during the normal run of the vehicle.

A quantity of the testing purpose program used for the inspection (the inspection means the (screening) test of the presence or absence of the initial failure in the microcomputer) and for the burn-in becomes tremendous so that a capacity of the nonvolatile ROM needs to be enlarged and a consequent cost of actually mounting the engine controller in the vehicle becomes accordingly high.

Furthermore, since, in the previously proposed vehicular engine control apparatus, the EEPROM is used as the nonvolatile ROM, the data written into the EEPROM is often erased so that the EEPROM lacks a reliability as the read only memory in the microcomputer.

SUMMARY OF THE INVENTION

It is, therefore, an object of the present invention to provide vehicular control apparatus having a microcomputer (also called, a micro controller) and arranged for undergoing a burn-in and subsequent initial failure test and method arranged therefor which can, cost-effectively, reliably, and with an addition of simple circuits, undergo the burn-in and subsequent initial failure test for a vehicular electronic unit of the vehicular control apparatus in which the bare-chip type microcomputer (micro controller) has been mounted on a printed circuit board.

The above-described object can be achieved by providing a vehicular control apparatus in combination with an external testing apparatus used for determining an initial failure of the vehicular control apparatus, comprising: a) a vehicular electronic unit mounted on a printed circuit board in a bare-chip form and having a micro controller, the micro controller having at least a micro processing unit and a first read only memory in which a predetermined control program is stored, the micro processing unit being operated to decode instructions of the predetermined control program and to execute the instructions of the predetermined control program so as to control an object to be controlled through a vehicular actuator external to the vehicular electronic unit in a desired fashion after an initial failure test is carried out for the vehicular control apparatus and the micro controller is determined to be operated normally upon the initial failure test; b) a high voltage bias supply arranged in the electronic unit for supplying a predetermined higher bias voltage than a normal bias voltage to the micro controller so as to impose a high stress on the micro controller under a burn-in condition; c) an initial failure testing purpose program transmitter having a second read only memory in which an initial failure testing purpose program is stored and arranged externally to the vehicular electronic unit so as to transmit the initial failure testing purpose program to the micro controller in response to an input of a test signal; d) a receiver mounted in the micro controller so as to receive the initial failure testing purpose program from the initial failure testing purpose program transmitter, the initial failure testing purpose program being prepared to evaluate an operation of the micro controller after the micro controller has undergone a burn-in with the high stress imposed on the micro controller; e) a test signal generator arranged in the testing apparatus for outputting the test signal so as to start the initial failure test; and f) a first selector mounted in the micro controller which is operated in response to the input of the test signal to select instructions of the initial failure testing purpose program and output the selected instructions to the micro processing unit.

The above-described object can also be achieved by providing a method for carrying out an initial failure test to determine whether an initial failure of a micro controller of a vehicular control apparatus occurs, the method comprising the steps of: a) applying a predetermined bias voltage higher than a normal voltage to the micro controller of the vehicular control apparatus, the micro controller being mounted on a printed circuit board in a bare-chip form and being exposed under a burn-in high temperature; b) maintaining the application of the predetermined higher voltage supply to the micro controller for a burn-in time duration; c) providing a test signal for en external clock signal generator to generate an external clock signal and output the external clock signal to the micro controller, the micro controller being operated on the basis of the external clock signal as its basic clock in place of an internal clock signal; d) transmitting, responsive to the test signal, an initial failure testing purpose program to a serial communication circuit of the micro controller in synchronization with the external clock signal; e) selecting, responsive to the test signal, instructions of the initial failure testing purpose program transmitted at the step d) in place of those of a predetermined control program in accordance with which the micro controller executes a control of an object to be controlled in a desired fashion; f) decoding and executing the selected instructions of the initial failure testing purpose program at the step e) in synchronization with the external clock signal; and g) determining whether the initial failure occurs in the micro controller depending on whether a vehicular actuator associated with the micro controller is operated normally in response to a control signal derived from the micro controller according to contents of the selected instructions.

The above-described object can also be achieved by providing a control apparatus, comprising: an electronic unit mounted on a printed circuit board in a bare-chip form, the electronic unit having a micro controller, the micro controller having a microprocessing unit therein; first read only memory arranged in the micro controller and in which a predetermined control program is stored, the micro processing unit being normally operated to decode instructions of the predetermined control program and to execute the decoded instructions so as to control an object to be controlled in a desired fashion through an I/O device external to the micro controller; c) a receiver which is so arranged in the micro controller and constructed as to receive an external testing purpose program used for evaluating an operation of the micro controller in an initial failure test for the electronic unit; and d) a first selector which is so arranged in the micro controller and constructed as to operatively select instructions of the external testing purpose program received by the receiver and output the selected instructions to the micro processing unit in place of the instructions of the predetermined control program.

BRIEF DESCRIPTION OF THE DRAWINGS:

FIG. 1A is a control circuit block diagram of a vehicular control apparatus and an external initial failure testing apparatus in a first preferred embodiment according to the present invention.

BEST MODE FOR CARRYING OUT THE INVENTION

Reference will hereinafter be made to the drawings in order to facilitate a better understanding of the present invention.

Figure 1B:
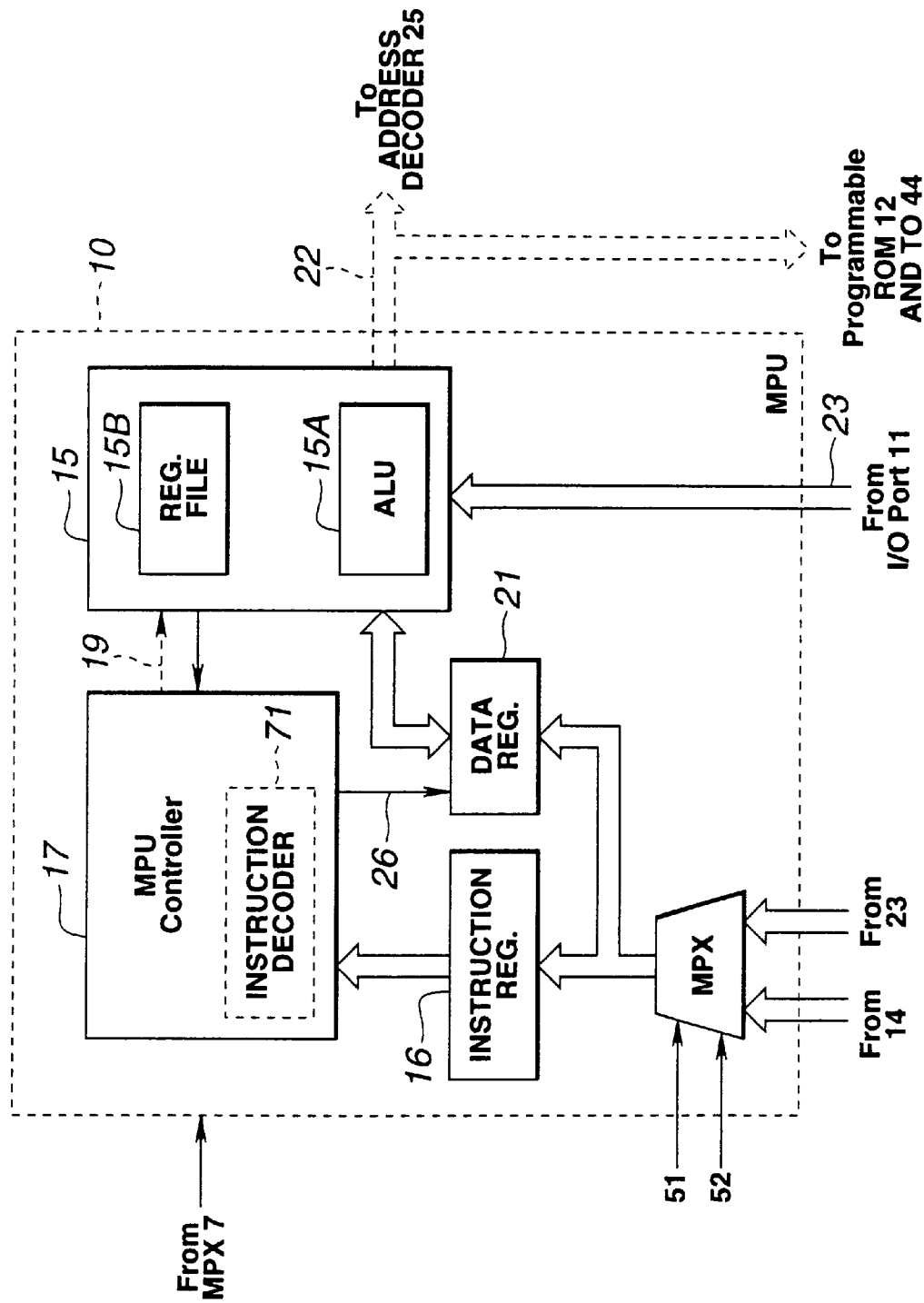
FIG. 1B is a detailed circuit block diagram of an MPU of a micro controller shown in FIG. 1A.

FIG. 1A and 1B integrally show a vehicular control apparatus in a first preferred embodiment according to the present invention and in a combination with a testing apparatus used to perform a burn-in and an initial failure testing for the vehicular control apparatus therethrough.

As shown in FIGS. 1A and 1B, a vehicular electronic unit 1A normally controls an operation of a vehicle part (an object to be controlled) through a vehicular actuator 20 (for example, a solenoid valve of an automatic power transmission or an ignition device of a vehicular engine) via an input processor 2 and an output processor 3. A voltage stabilizer 21 converts an input voltage supplied from a vehicular battery 30 into a voltage required for a one (single)-chip micro controller 8 (hereinafter, called a micro controller) (or also called a microcomputer) of a bare chip form, the input processor 2, and the output processor 3 as a bias supply (generally denoted by $V_{cc}$ or $V_B$). It is noted that the electronic unit 1A in which a bare-chip mounting technique is adopted is mounted on a printed circuit board as denoted by a dotted line of 8.

An internal clock oscillator (internal clock generator) 5 oscillates a crystal oscillator (quartz) 6 arranged externally to the micro controller 8 (but arranged on the electronic unit 1A) and outputs a predetermined (internal) clock signal to an MPU 10 and a serial communication circuit 13 as will be described later in details.

Figure 3:
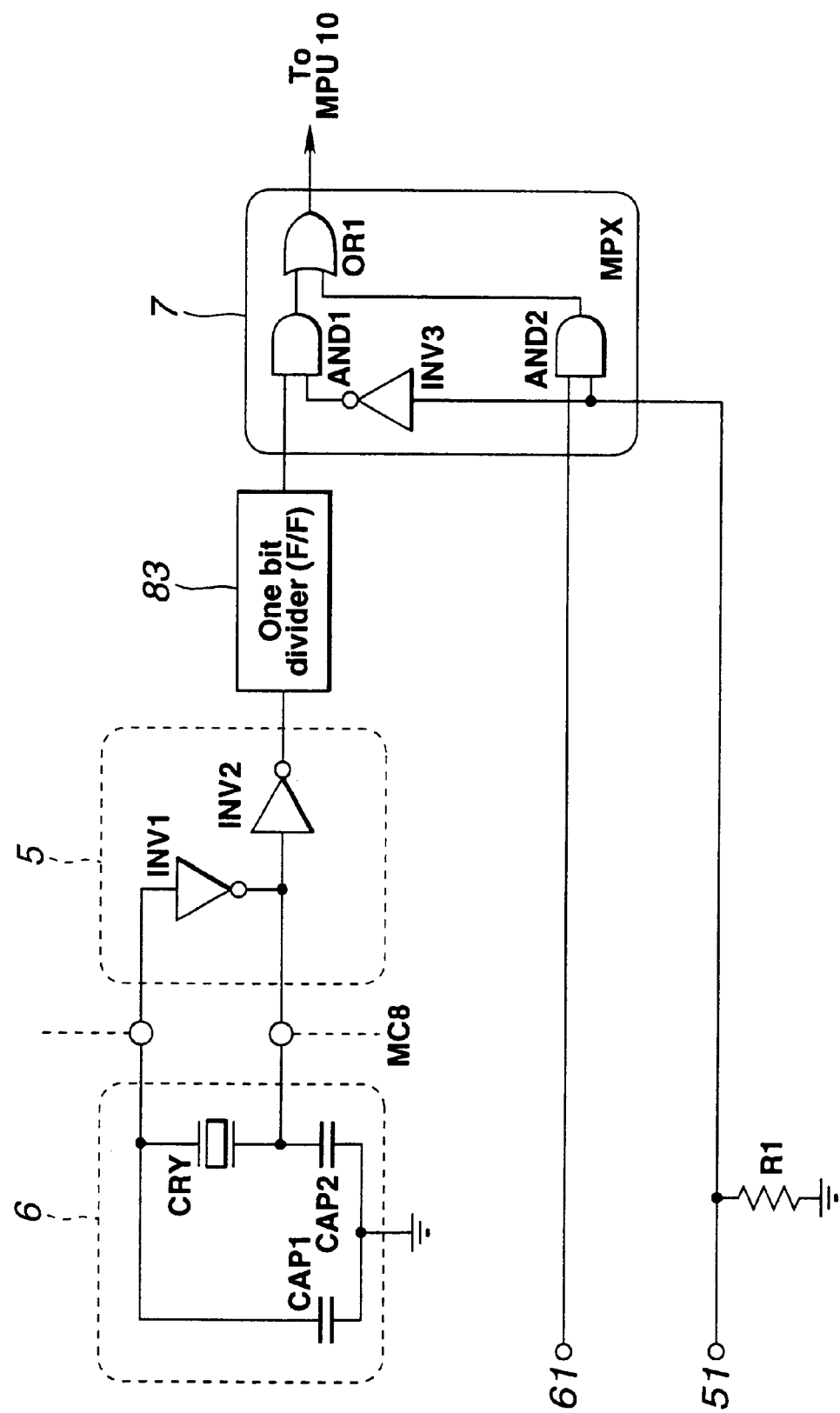
FIG. 3 is a detailed circuit block diagram of an internal clock signal generator and its surrounding circuit shown in FIGS. 1A and 1B.

A multiplexor 7 is constituted by a two-input-and-one-output logic circuitry. The internal clock signal derived from the internal clock generator 5 is inputted to one of the two input ends of the multiplexor 7 and an external clock signal 61 is inputted to the other input end of the multiplexor 7. An input end of the multiplexor 7 is connected to a clock end of a micro processing unit (hereinafter, referred to as the MPU) 10 so as to output a selected one of the internal or external clock signal. As shown in FIG. 3, the multiplexor 7 includes: two AND circuits AND1 and AND2; an invertor INV3; and an OR circuit OR1. The detailed connection relationship shown in FIG. 3 will be described later.

The micro controller 8 includes: an Input/Output port 11, a programmable read only memory (for example, a mask ROM) 12, a random access memory 24, and a serial communication circuit (interface) (SCI) 13 in addition to a part of the internal clock generator 5, the MPU 10, and the multiplexor 7.

It is noted that a burn-in condition is established under a high ambient temperature (for example, approximately 125° C.) (the electronic unit 1A and an external I/O device 20 (a pseudo actuator may be used or including the vehicular actuator 20A) is inserted into a temperature bath), with a higher voltage applied to the electronic unit 1A through the voltage stabilizer 4), and for a predetermined burn-in time duration (for example, 10 hours through 20 hours) in order for the electronic unit 1A to be under a high stress) to evaluate an operation of the vehicular control apparatus after such a high stress as described above has been imposed on the electronic unit 1A, particularly, on the micro controller 8. Hence, after the burn-in and subsequent initial failure test are carried out, the whole electronic unit 1A is determined to operate normally (without initial failure), the electronic unit 1A and the I/O device 20 are mounted in the vehicle after the shipment, and the microcontroller 8 is, in turn, operated in accordance with a predetermined control program (e.g., predetermined ignition timing control program) stored in the read only memory ROM 12 during, e.g., a run of the vehicle.

In details on the MPU 10, a data path circuit 15 (shown in FIG. 1B) includes: an ALU 15A (Arithmetic and Logic operation Unit) provided to perform arithmetic and logic calculations of data fetched therein; and a register file 15B having a plurality of registers. The register file 15B functions as a temporary storage of data to be handled in the MPU10. An instruction register 16 fetches each of the program code including instruction codes (operation codes) stored in the programmable read only memory ROM 12 thereinto. An MPU controller 17, including an instruction decoder 71 decoding the instruction codes in the fetched program code, outputs the decoded instruction code as an output control signal 19 to the data path circuit 15. The multiplexor (MPX) 18 is so arranged as to select either outputs from the Input/Output Port 11 on an internal bus 23 or outputs from a receive register 14 of the serial communication circuit (SCI) 13 and as to output the selected outputs to the instruction register 16 and a data register 21 of the MPU 10.

Figure 7:
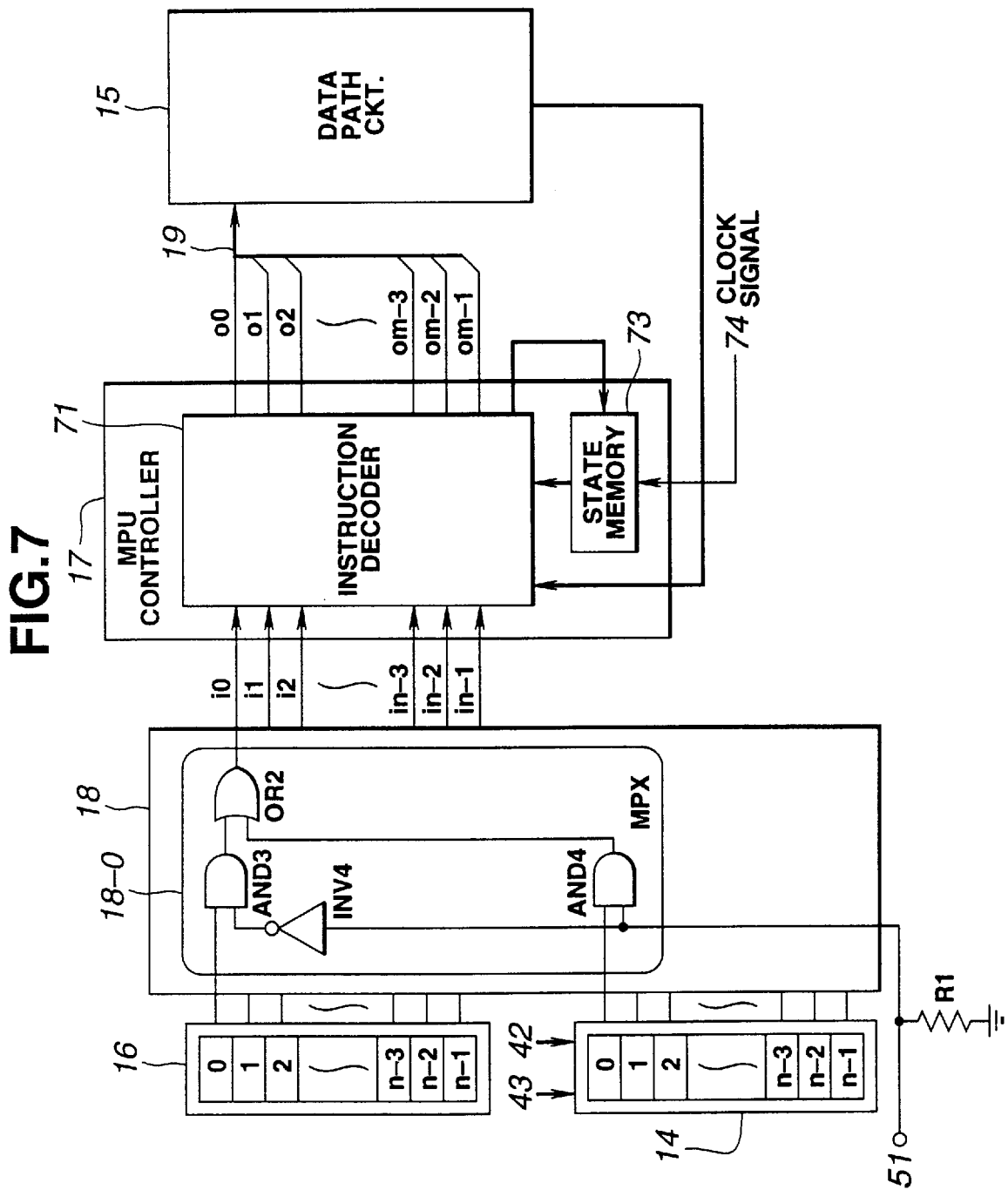
FIG. 7 is a connection diagram of the internal circuit of the MPU, the receive register, an instruction register, and the multiplexor shown in FIG. 6.

It is noted that, in a case of a second embodiment to be described later, the multiplexor (MPX) 18 selects outputs from the instruction register 16 or the receive register 14 and outputs the selected outputs therefrom to the instruction decoder 71 as shown in FIG. 7.

The MPU 10 is generally called a super miniaturized arithmetic processing unit (so-called, Micro Processing Unit) and finishes a stage such as a read-in of an instruction code, a decoding of the instruction code, an execution of the instruction, an access to a memory or each register, and a write of a result of arithmetic operation into the memory or each register by the execution of one instruction.

The Input/Output Port 11 administrates of data reception and data transmission between the input processor 2 and the MPU 10 and between the output processor 3 and the MPU 10. The programmable ROM 12 (in the first embodiment, the mask ROM is used) is a read only memory which stores a predetermined control program and control data for the micro controller 8 to prosecute a control over the object to be controlled in a desired fashion through the I/O device 20 (for example, an ignition timing control for each of engine cylinders of the vehicle in a feedback fashion according to an engine driving condition).

The serial communication circuit (interface) (SCI) 13 receives, using a clock synchronization type data transfer method, an evaluation (initial failure testing purpose) program (as will be described later) transmitted from an initial failure testing purpose program transmitter (transceiver) 40 through a transmission line (RX) 42 in synchronization with the external clock signal on the clock line (CLK) 43. A vehicular battery (DC power supply) 30 supplies a DC voltage thereacross to the voltage stabilizer 4.

The initial failure testing purpose program transmitter 40, arranged in the external testing apparatus 1B, transmits data (instructions) of the initial failure testing purpose program in synchronization with the external clock signal on the clock signal line 43 to the serial communication circuit (SCI) 13 via the transmission line 42. An external test signal generator 50 outputs a test signal 51 to simultaneously select inputs to be passed through the multiplexors 7 and 18. It is noted that the test signal 51 is inputted into the voltage stabilizer 4 from a different terminal of the test signal generator 50 from those to the external initial failure testing purpose program transmitter 40 and the multiplexors 7 and 18 (since the initial failure test is carried out after the start or end of the burn-in) so that an output voltage of the stabilizer 4 is switched to the higher voltage for the burn-in condition than the normal voltage, the higher voltage being supplied to the micro controller 8 and the input and output processors 2 and 3 to enter the burn-in condition. An external clock signal generator 60 oscillates and generates the external clock signal and outputs the external clock signal 61 to the multiplexor 7 during the initial failure test.

Figure 2:
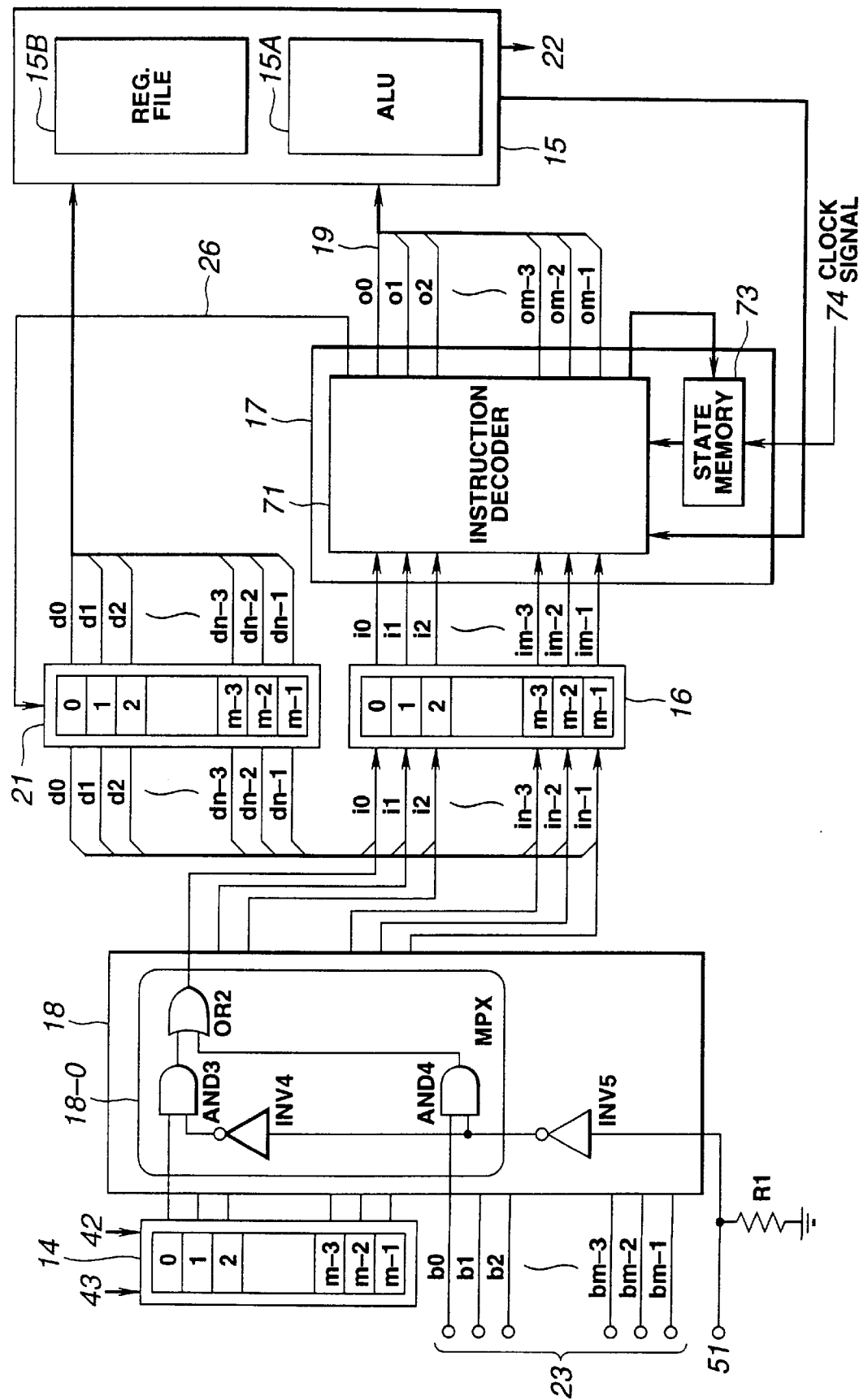
FIG. 2 is a connection diagram of an internal circuit of an MPU, a receive register, and a multiplexor of the MPU for explaining instructions and data flows in the MPU in the case of the first embodiment shown in FIGS. 1A and 1B.

Next, FIG. 2 shows the details of the content of the MPU 10 and peripheral input circuits about the MPU 10.

As shown in FIG. 2, the instruction register 16 and the receive register 14 internally located within the serial communication circuit (SCI) 13 comprise m bit registers (m denotes an arbitrary number (generally 2 raised to the third power or sixth power or so, for example, m=16). The receive register 16 receives serially each of the instruction codes sequentially transmitted from the external initial failure testing purpose program transmitter 40 and converts it into a parallel bit string so as to be outputted to the multiplexor 18.

The multiplexor 18 functions to switch parallel inputted bits from either the instruction register 16 or receive register 14 according to a status (state) of the test signal (active or not active) 51 and to output the selected parallel inputted bits to an instruction decoder 71 (having m bits) via the instruction register 16.

It is noted that according to the content of the selected instruction code, the selected instruction code is also inputted to the data register 21, as will be described later.

In the multiplexor 18 shown in FIG. 2, R1 denotes a pull down resistor connected across a test signal input end to be connected to the test signal generator 50 shown in FIG. 1A. For example, the multiplexor 18 includes: a first invertor INV5 connected to one end of the pull down register R1; and a plurality of multiplexor rows whose number corresponds to m bits, a first multiplexor row 18-0 having a first AND circuit AND3, one input end of the first AND circuit AND3 being connected to an output end of a second invertor INV4, one input end of a second AND circuit AND4 being connected to a b0 bit position of the internal bus 23, the other input end of the second AND circuit AND4 being outputted to an OR circuit OR2, and an output end of the OR circuit OR2 being connected to both 0 bit positions of the instruction register 16 and data register 21.

A state memory circuit 73 receives the clock signal 74 and outputs from the instruction decoder 71 and determines a number of states (i.e., which number of an instruction processing the MPU 10 is currently executing) according to the received clock signal and content of the outputs from the instruction decoder 71.

An operation in the micro controller 8 will be described below.

The MPU controller 17 outputs the control signal 19 to the data path circuit 15 to fetch an instruction thereinto, the data path circuit 15 outputting an address to an address bus 22 to read a program code stored in the read only memory (programmable ROM) 12. The programmable ROM 12 outputs an instruction code to be executed at the next machine cycle according to the address indicated in the address bus. The instruction code is fetched into the instruction register 16. Next, the MPU controller 17 decodes the instruction code fetched by the instruction register 16. Next, the control signal to execute the operation in accordance with the instruction is outputted to the data path circuit 15 and prepares for the next machine cycle.

In FIG. 3, when the line of the test signal 51 is set to the logical low state, the internal clock (clock pulse) signal generated by the whole internal clock signal generator 5, 6, and 83 is outputted to the MPU 10 as a, so-called, basic clock.

Next, the initial failure testing operation of the vehicular electronic unit 1A will be described below with reference to FIGS. 1A to 3.

When the burn-in is performed, the whole electronic unit 1A is inserted into the temperature bath. The external (initial failure) testing apparatus 1B having the test signal generator 50, the external clock generator 60, and the external testing purpose program transmitter 40 operatively provides the test signal 51 for the multiplexor 18 so as to select the outputs of the receive register 14 from the external test signal generator 50. That is to say, the terminal for receiving the test signal at the multiplexor 18 is set (active) to a logical high state.

FIG. 3 shows the details of the multiplexor MPX 7 to switch either the internal or external clock signal to be inputted to the MPU 10.

The crystal oscillator 6 is provided with a quartz oscillator CRY and two parallel capacitors CAP1 and CAP2 to oscillate a signal having a predetermined oscillation frequency depending upon the use of the quartz oscillator CRY. A waveform shaper 5 having two invertors INV1 and INV2 is connected to the crystal oscillator 6. Thereafter, one bit frequency divider 83 is connected to an output end of the waveform shaper 5. The one bit frequency divider 83 divides the oscillation frequency by half (½ divider). The one bit frequency divider includes one flip-flop (F/F) having a D input connected to a reversed Q output thereof. The multiplexor (MPX) 7 receives the frequency divided internal clock signal from an output end (Q output) of the frequency divider 83 or receives the external clock signal 61 from the external clock signal generator 60. The multiplexor (MPX) 7 selects which inputted clock signal from the internal clock signal generator 6, 5, and 83 or the external clock signal generator 61 should be sent to the MPU 10 according to the state of the test signal 51. The clock signal selected is outputted to the MPU 10. It is noted that R1 in FIG. 3 denotes the pull down resistor which forcefully sets a logical low on the test signal line 51 connected to the external test signal generator 50 when no test signal 51 is inputted to the multiplexor MPX 7.

Next, the operation of the vehicular electronic unit 1A will be described during a normal use thereof (for example, with the I/O device mounted on the vehicle, the vehicle is running) with reference to FIGS. 1A to 3.

When the vehicular electronic unit 1 is normally used, the test signal 51 to be supplied to the multiplexor 7, the multiplexor 18, the voltage stabilizer 4 is turned to a logical low level (Low) or to an open (high impedance) state.

In this case, the multiplexor 18 selects the outputs from the instruction register 16. In addition, the multiplexor 7 selects the clock signal after the frequency division by means of the one bit frequency divider 83. Furthermore, an output voltage of the voltage stabilizer 4 is set to a normally used voltage (for example, 5 volts).

The initial failure testing purpose program is transferred to the serial communication circuit (SCI) 13 using the transmission lines (RX) 42 and (CLK) 43 from the initial failure testing purpose program transmitter 40 in synchronization with the external clock signal. The data used for the initial failure test and contained in the initial failure testing purpose program and the external clock used for the micro controller 8 to read the received data are outputted from the external initial failure testing purpose program transmitter 40 via respective transmission lines 42 and 43.

Next, the receive register 14 incorporated into the serial communication circuit (SCI) 13 transfers the received program code (normally, operational code and operands) to the instruction decoder 71 of the MPU controller 17 via the multiplexor 18.

Next, the MPU controller 17 determines the content of the control signal 19 to control the data path circuit 15.

It is noted that the external clock signal of the external clock signal generator 60 inputted into the multiplexor 18 in response to the external test signal 51 is inputted to the data path circuit 15 as the basic clock on which the data path circuit 15 is operated.

It is noted that the external clock signal generator 60, the external test signal generator 50, and the initial failure testing purpose program transmitter 40 are all synchronized with one another. The external testing purpose program transmitter 40 and the external clock generator 60 are activated. Whenever the external initial failure testing purpose program transmitter 40 transmits one instruction to the serial communication circuit (SCI) 13, the clock required for the MPU 10 to execute one instruction transmitted therefrom is supplied by the external clock generator 60.

Figures 4A, 4B:
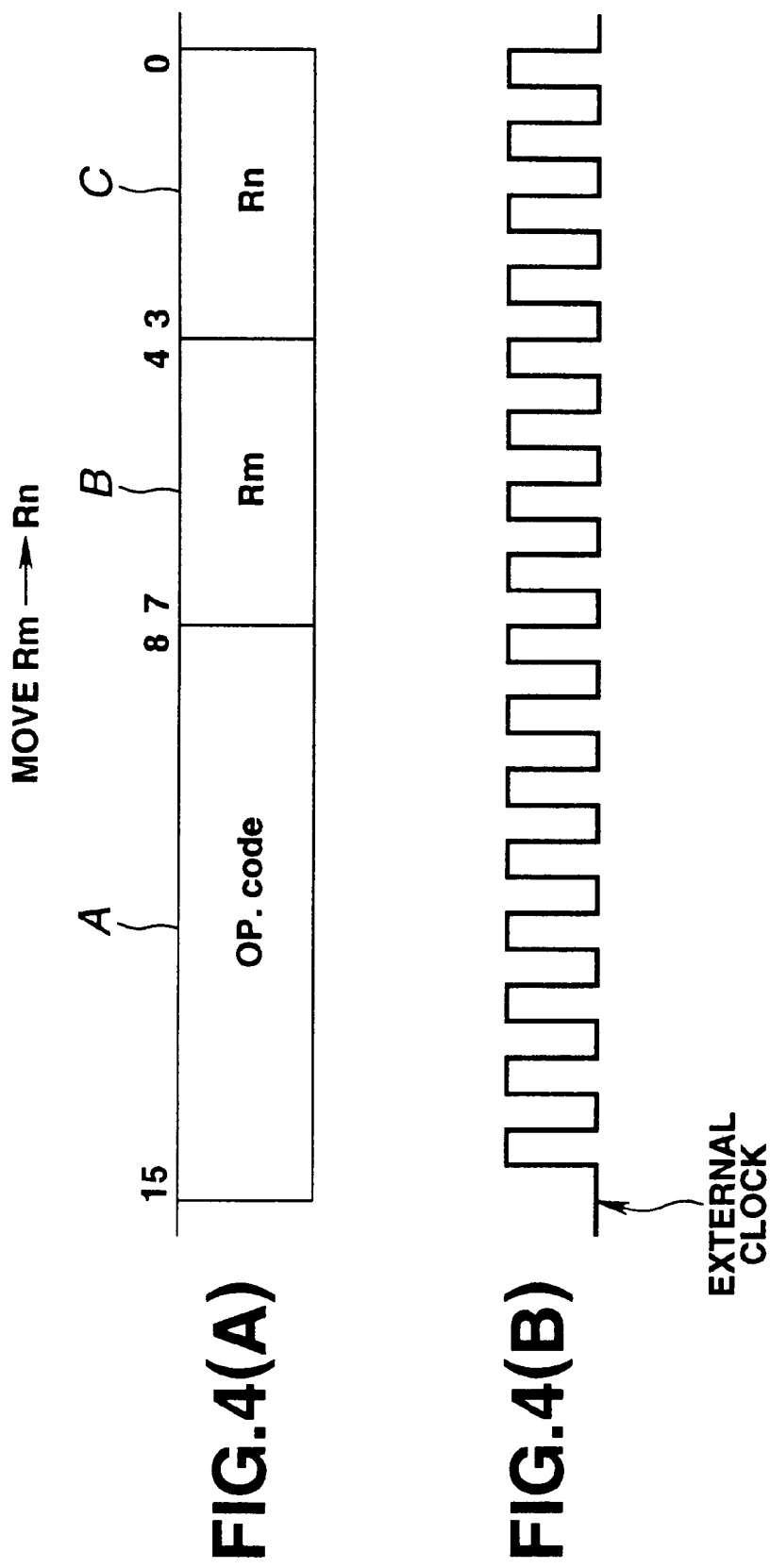
FIGS. 4(A) and 4(B) are a communication format of one of instructions of an external initial failure testing purpose program and an external clock signal in synchronization with which the instruction is transmitted to a serial communication circuit of the micro controller shown in FIG. 1A.

FIGS. 4(A) and 4(B) show one example of the program code to be transferred from the external initial failure testing purpose program transmitter 40 via the serial communication circuit (SCI) 13 to the MPU 10 and the external clock signal waveform used for the transfer of the program code to the receive register 14 of the serial communication circuit 13, respectively.

In a case where the initial failure testing purpose program is transferred by one word (one word means, for example, 16 bits) into the receive register 14 of the serial communication circuit (SCI) 13, the instruction code such as to satisfy a transfer format shown in FIG. 4(A) is prepared.

In addition, number of bits in the transfer format in FIG. 4(A) which are used in the transmission of one program code are 16 bits in a method of NRZ (Non Return to Zero).

At this time, a synchronous transmission system is adopted in which a reading clock is transmitted at the same time as the data.

For example, in a case where a move instruction (MOV) to move (transfer) the data on the register Rm into the register Rn, an eight-bit instruction code (A), four-bit register addresses (B) and (C) are continuously transmitted in the method of NRZ and the read clock shown in FIG. 4(B) is transmitted at the same time.

Figure 5:
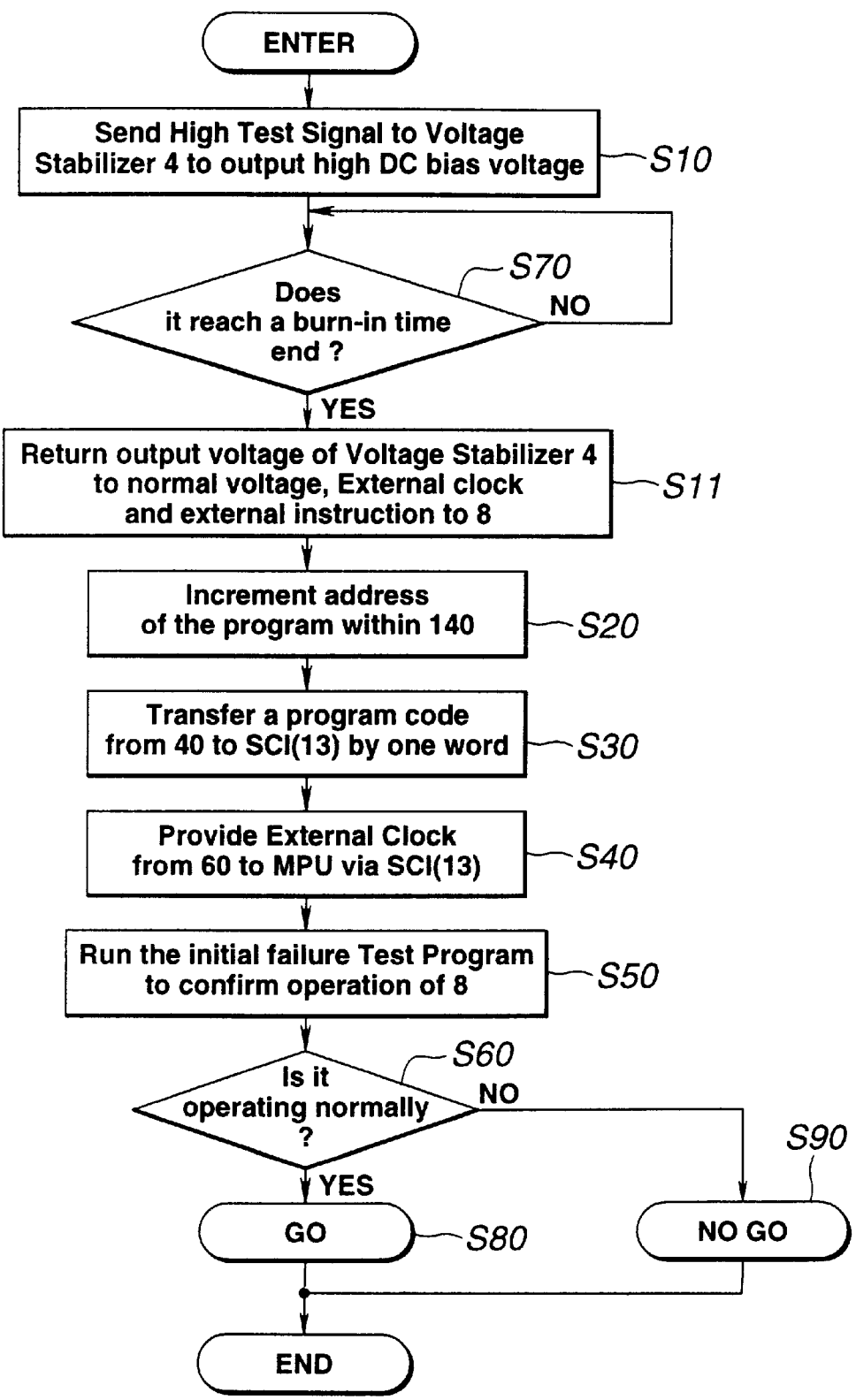
FIG. 5 is an operational flowchart for the electronic unit shown in FIG. 1A to undergo an initial failure test after a burn-in for the micro controller bare-chip mount formed electronic unit is carried out.

Next, FIG. 5 shows an operational flowchart for explaining the burn-in and the initial failure test on the vehicular electronic unit 1A.

At a step S10, the test signal on the line 51 in the logical high level state (active state) generated from the external test signal generator 50 is supplied to the voltage stabilizer 4 of the electronic unit 1A which is exposed to the burn-in ambient temperature.

At the step S10, the voltage stabilizer 4 outputs approximately seven volts in place of the normally outputted approximately five volts so that the whole electronic unit 1A is enabled to be set in a state where the burn-in is carried out.

Hence, when the output voltage of about seven volts is outputted from the voltage stabilizer 4, the whole electronic unit 1A enters the burn-in condition and the initial failure testing purpose program transmitter 40 starts itself a measurement of the burn-in test time duration in synchronization with the external test signal generator 50.

At a step S70, the initial failure testing purpose program transmitter 40 determines whether the present time has reached the predetermined burn-in time end. The step S70 is repeated until the predetermined burn-in time has passed.

When the burn-in time has passed (Yes) at the step S70, the routine goes to a step S11.

At the step S11, in order to start the initial failure test, the output voltage of the voltage stabilizer 4 is returned to the normal bias voltage of five volts in response to the test signal again from the test signal generator 50.

In addition, the external clock signal is supplied to the initial failure testing purpose program transmitter 40 in response to the test signal so that the initial failure testing purpose program transmitter 40 prepares the first instruction code to be transmitted to the serial communication circuit (SCI) 13. The electronic unit 1A after the burn-in may be extracted from the temperature bath or may undergo the initial failure test with the electronic unit 1A inserted into the temperature bath.

At the next step S20, the testing purpose program transmitter 40 increments the address of the internal ROM storing previously the initial failure testing purpose program by one.

Thus, one-word program code is read into the receive register 14.

At the next step S30, the testing purpose program transmitter 40 transfers the initial failure testing purpose program in a unit of one word using the clock synchronized type data transmission to the receive register 14 of the serial communication circuit (SCI) 13 via the transmission line 42 and the clock signal line 43.

At a step S40, in order to execute the program code received by the receive register 14, the external clock signal is outputted from the external clock signal generator 60 so as to provide the one-word instruction code for the receive register 14 in a bit-serial-and-byte-serial manner.

It is noted that in a case where the received one-word instruction is, for example, an OUT instruction to actuate the vehicular actuator 20A of the I/O device 20, the control signal derived from the MPU controller 10 is transmitted from the I/O Port 11 to the vehicular actuator 20 via the output processor 3 and, consequently, the actuator 20A is operated in a required fashion.

At the next step S50, whenever one instruction is executed, the external testing apparatus 1B confirms the operation of the vehicular actuator 20A, as a result of operation of the electronic unit 1A.

It is noted that, during such a testing as the initial failure testing, normally, a pseudo load simulating the actual vehicular actuator 20A is connected to the vehicular electronic unit 1A. Consequently, the external testing apparatus 1B monitors the output of the control signal derived from the electronic unit 1A via a transmit register 44. These series of operations are carried out by the external electronic unit testing apparatus 1B. The external clock signal generator 60, the external test signal generator 50, and the initial failure testing purpose program 40 are all incorporated into the electronic unit testing apparatus.

At a step S60, the electronic unit testing apparatus 1B makes an automatic check on predetermined operation confirmation series of items and determines whether the electronic unit 1A operates normally.

If the external electronic unit testing apparatus 1B determines that the electronic unit 1A operates normally at the step S60, the routine of FIG. 5 goes to a step S80 in which the external testing apparatus 1B determines that the electronic unit 1A is a good product (not defective).

If NO at the step S60, the external testing apparatus 1B determines that the electronic unit 1A to be under the burn-in and which has undergone the initial failure test is not a good product (defective) at a step S90. It is noted that every electronic unit 1A which is determined to be defective, i.e., in which the initial failure is determined to occur is disposed of and only electronic control unit 1A which is determined to operate normally is used as the control apparatus for the vehicle operation actually mounted in the vehicle.

Figure 8:
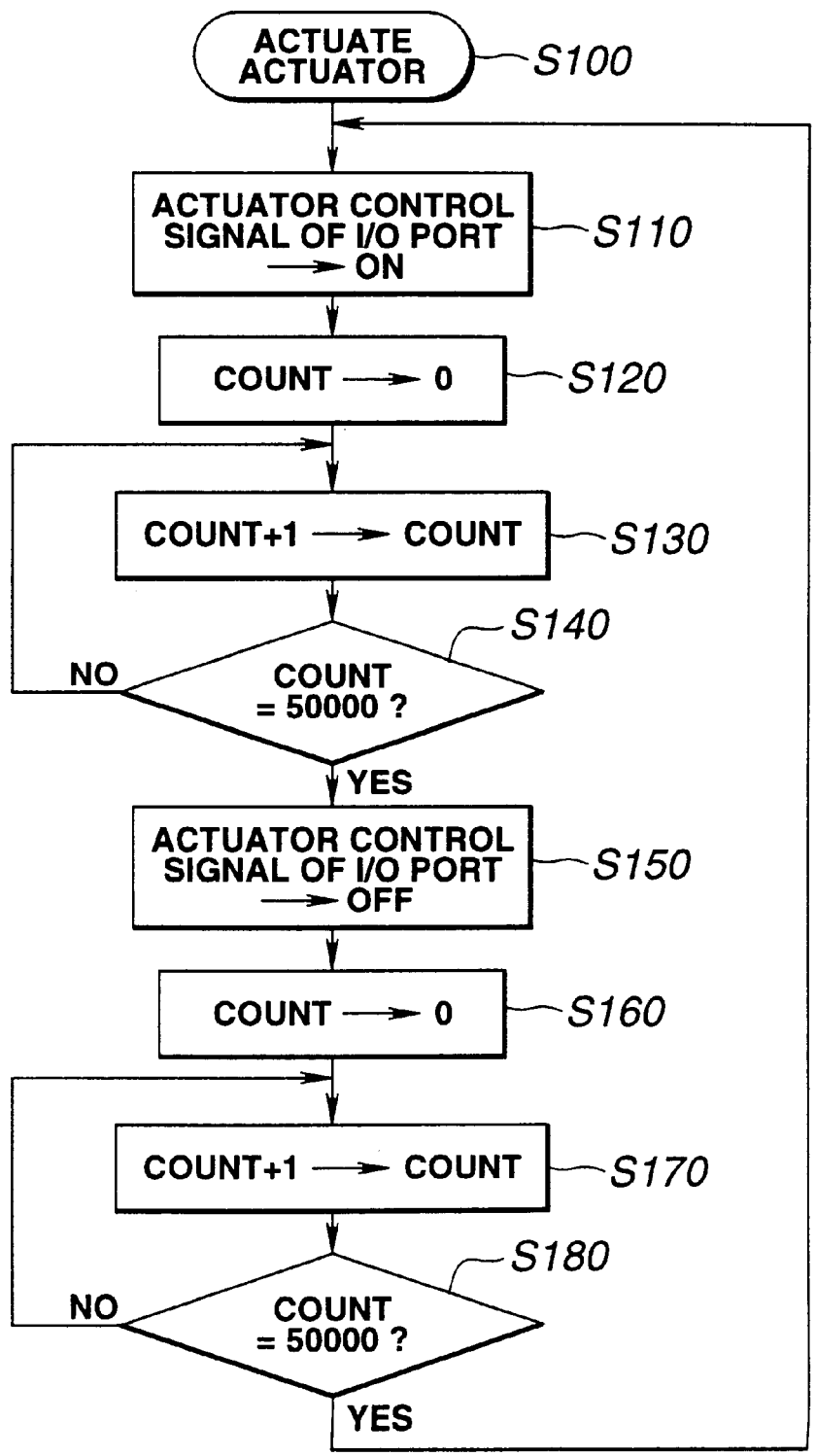
FIG. 8 is an example of a flowchart indicating the external initial failure testing purpose program applicable to the first or second embodiment.

FIG. 8 shows an example of the flowchart executed by the external testing apparatus 1B for the electronic unit 1A to test to check whether the initial failure occurs in the micro controller 8 at the step S50 of FIG. 5.

The initial failure testing purpose program stored in the read only memory (ROM) 140 is transmitted serially by one word to the MPU 10 in which the initial failure testing purpose program, for example, shown in FIG. 8 is executed.

For the burn-in, there are variety of methods. In this embodiment, a dynamic burn-in such that the bare-chip micro controller is operated for predetermined several hours under the higher temperature and higher voltage application than the normal temperature and normal voltage application.

FIG. 8, thus, shows the flowchart in a case where the pseudo load corresponding to the vehicular actuator 20A is turned on and off alternatingly whenever 50 milliseconds have passed.

That is to say, at a step S110, the MPU 10 turns on a Port output of the I/O Port 11 to actuate the vehicular actuator (pseudo load) 20A to turn on. Thereafter, at a step S120, a variable COUNT is reset to "0".

At a step S130, the MPU 10 increments the variable COUNT by plus one. It is noted that a clock period of the external clock generator 60 needs to be adjusted so that a line required to make COUNT by plus one is set to 1 μs.

Hence, at a step S140, the MPU 10 determines whether the variable COUNT has reached 50000 μs (50 ms). If the variable COUNT has reached 50000 μs (50 ms), the routine returns to a step S150. At the step S150, the MPU 10 turns off the Port output of the I/O Port 11 to turn off the pseudo load.

In the same way, after 50 ms is counted at steps S160, S170, and S180, the routine returns to a step S110.

At the step S110, the MPU 10 again turns on the Port output of the I/O port 11 to actuate the vehicular actuator (pseudo load) to turn on until the variable COUNT reaches 50000.

The routine shown in FIG. 8 is repeated until the power supply to the whole electronic unit 1A is turned off. Thus, the electronic unit 1A carries out such a simple operation as to turn on and off during the burn-in testing.

Figure 6:
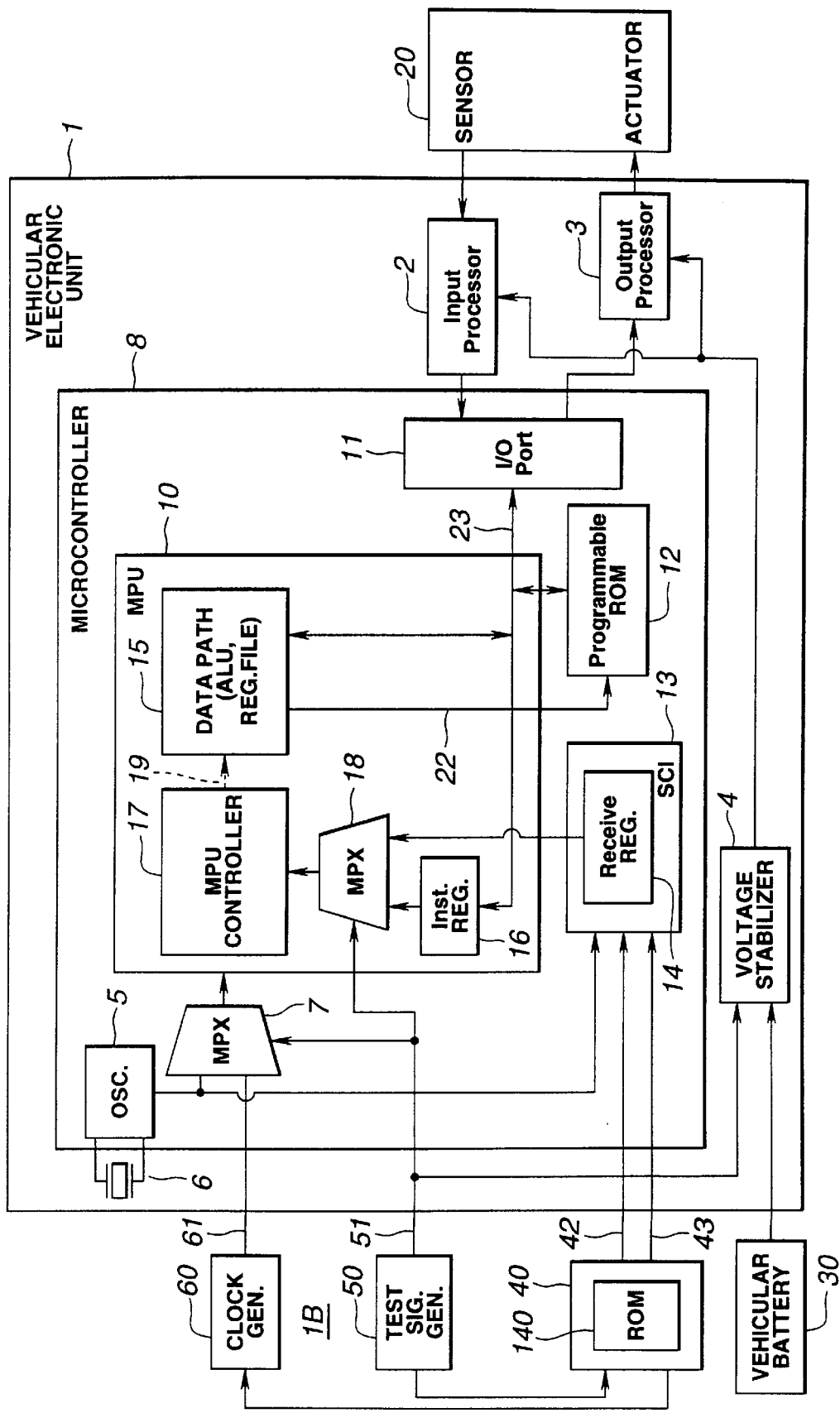
FIG. 6 is a whole circuit block diagram of the vehicular control apparatus and the external initial failure testing apparatus in a second preferred embodiment according to the present invention.

FIGS. 6 and 7 show the second preferred embodiment of the vehicular control apparatus arranged for undergoing the burn-in and the subsequent initial failure test and the connected state to the external initial failure testing apparatus 1B.

It is noted that the same reference numerals in the second embodiment as those in the first embodiment designate corresponding elements.

Described hereinbelow are only the difference between the first embodiment shown in FIGS. 1A and 1B and the second embodiment shown in FIGS. 6 and 7 and the operation of the first embodiment shown in FIGS. 1A and 1B on the basis of the difference.

In the second embodiment shown in FIGS. 6 and 7, each of the instruction codes of the initial failure testing purpose program is only transferred to the serial communication circuit (SCI) 13 via the transmission line 42 in synchronization with the external clock signal on the line 43.

In the first embodiment shown in FIGS. 1A and 1B, on the other hand, the data in the data register(s) installed within the data path circuit 15 can be modified via the serial communication line 41.

Thus, in the first embodiment shown in FIGS. 1A and 1B, the micro controller 8 can handle the initial failure testing purpose program in which such instructions as those having operands of data, e.g., immediate instructions, unconditional jump instructions, and branch instructions are included.

Although the configuration in the second embodiment shown in FIGS. 6 and 7 permits a basic operation of the micro controller 8, the configuration in the first embodiment shown in FIGS. 1A and 1B permits a more complicated operation of the micro controller 8.

Furthermore, the arranged position of the multiplexor 18 is different from each other.

That is to say, in the second embodiment shown in FIG. 7, the multiplexor 18 is interposed between the instruction register 16 and receive register 14 and the instruction decoder 71 of the MPU controller 17. On the other hand, in the first embodiment shown in FIG. 2, the multiplexor 18 is interposed between the receive register 14 and internal bus 23 and the instruction register 16 and the data register 21. The data register 21 is already present in the data path circuit 15, in the first embodiment.

In details, in the first embodiment, the multiplexor 18 receives parallel outputs of both receive register 14 and internal data bus 23, selects either of the parallel outputs of the receive register 14 or the internal data bus 23 according to a state of the MPX selection signal derived from the initial failure testing purpose program transmitter 40 on the line 52, and outputs the selected parallel outputs to the instruction register 16 and the data register 21.

In addition, the address bus 22 is derived from the data path circuit 15 and is connected to the programmable ROM 12, to the random access memory 24 storing the processed control information (data), and to the address decoder 25.

The address decoder 25 serves to decode the address allocated to the Input/Output Port 11 when the address is accessed.

In the first embodiment, the output of the address bus 22 is inputted to a transmit register 44 of the SCI 13.

The address information stored in the transmit register 44 is outputted to the initial failure testing purpose program transmitter (transceiver) 40 via a newly added transmission line (TX) 41.

Thus, the MPU controller 17 can transfer serially the address in the programmable ROM 12 to be read at the next cycle to the external initial failure testing purpose program transmitter 40.

In addition, the address is changed according to the calculation result of the data path circuit 15 to determine the next operation of the micro controller 8.

Next, the operation of the first embodiment during the burn-in and during the subsequent initial failure test will be described below.

During the burn-in, the whole electronic unit 1A (including the I/O device 20 having the pseudo vehicular actuator 20A) is inserted into the temperature bath to be exposed to the burn-in temperature for the burn-in time duration. At this time, the test signal derived from the test signal generator 50 is outputted to the voltage stabilizer 4 so as to output the predetermined high voltage (approximately seven volts) to the micro controller 8 and the input and output processors 2 and 3 as the higher bias voltage ($V_{cc}$ and $V_B$) to impose a high stress on the electronic unit 1A.

It is noted that the voltage stablizer 4 may have a memory switch (for example, flip-flop) to change its output stabilized voltage to the predetermined high voltage in response to the input test signal. When the test signal is first inputted to the voltage stabilizer 4, the voltage stabilizer 4 is switched and held to output the predetermined higher bias voltage (about seven volts) for the burn-in. When the test signal is again inputted to the voltage stabilizer 4 to start the initial failure test after the burn-in, the voltage stabilizer 4 is switched and held to output the normal bias voltage (five volts) to the micro controller 8 and the input and output processors 2 and 3. It is also noted that the voltage stabilizer 4 may have a changeover switch which is turned on for the voltage stabilizer 4 to output the predetermined burn-in voltage while the test signal is received thereat and is turned off for the voltage stabilizer to output the normal bias voltage while no test signal is received thereat (while the initial failure test is carried out).

After the burn-in, the test signal is outputted to turn the external test signal terminal 51 at the logical high state so that the clock on the basis of which the micro controller 8 is operated is switched from the internal clock signal derived from the internal clock signal generator 5 to the external clock signal derived from the external clock signal generator 60 via the multiplexor 7.

It is noted that the structure of the external clock signal generator 60 is generally similar to the internal clock signal generator 5, 6, 83 shown in FIG. 3 and the clock frequency of the external clock signal may be the same or different from that of the internal clock signal generator 5, 6, 83.

At the same time as the activation of the external clock signal generator 60, the initial failure testing purpose program transmitter 40 transmits a first instruction code to the serial communication circuit SCI 13 via the transmission line 42 (also called, a receiving line RX).

When the micro controller 8 receives the instruction code at the receive register 14 via the transmission line (RX) 42, the micro controller 8 stores the received code into the instruction register 16 via the multiplexor 18. When the MPU controller 17 determines that the received instruction code is an instruction code in which a direct (immediate) data (operand(s)) is included, the control signal 26 is outputted to the data register 21 so that the direct data included within the received instruction code is stored into the data register 21.

The data path circuit 15, thus, carries out the arithmetic operation processing using the data in the data register 21.

In a case where the received instruction code indicates an instruction to store the data in the RAM 24 into the data register 21, it is necessary to switch temporarily the selection of the multiplexor 18 to the internal data bus 23. To do this, an MPX control signal 52 derived from the initial failure testing purpose program transmitter 40 is transmitted to the multiplexor 18 via the line 52. Thus, the initial failure testing purpose program transmitter 40 confirms the address information on the address bus 22 using a method described later. When the address on the RAM 24 is outputted, the MPX control signal 52 is turned to the logical low state so that the selection of the parallel outputs of either the receive register 14 or the internal data bus 23 is changed to the parallel output of the internal data bus 23.

These series of operations are executed, the initial failure testing purpose program transmitter 40 controlling the external clock signal from the external clock signal generator 60. When the initial failure testing purpose program transmitter 40 monitors a time at which one machine cycle is finished, the transmitter 40 returns the MPX control signal 52 again to select the parallel outputs of the receiver register 14 side via the multiplexor 18.

The micro controller 8 goes into a wait state until the instruction code to be executed at the next machine cycle is transferred from the initial failure testing purpose program transmitter 40.

In the first embodiment, thus, the executions of such instruction codes as those including the direct data in the instruction format and those handling the data in the RAM 24 are possible via the external instruction serial instruction transferring method.

Next, the operation such that the micro controller 8 outputs the address information on the address bus 22 externally will be described below.

Since the address bus 22 is connected to the SCI 13, the corresponding address is stored into the transmit register 44 whenever each of the addresses is outputted from the data path circuit 15.

The initial failure testing purpose program transmitter 40 outputs a communication control signal 41 (denoted by DR in FIG. 1A) to the SCI 13 to request the SCI 13 to transmit the address stored in the transmit register 44. Upon receipt of the communication control signal 41 from the initial failure testing purpose program transmitter 40, the SCI 13 outputs the address information stored within the transmit register 44 to the initial failure testing purpose program transmitter (transceiver) 40.

This function is effective when the instruction code to be executed next is different according to a result of the processing by the data path circuit 15.

The data path circuit 15 outputs the address of a stored destination for the instruction to be fetched next to the address bus after the calculation processing. At this time, the initial failure testing purpose transmitter 40 monitors the address information transferred in the serial data transmission method. The initial failure testing purpose program transmitter 40 monitors the operation of the micro controller 8 while transmitting the instruction code to be executed by the micro controller 8 at the next machine cycle.

In this way, in the first embodiment, the executions of the more complicated instructions such as branch instructions like a conditional branch, and jump instructions which modify the program flow are possible via the serial instruction and address transfer between the internal and external to the micro controller 8.

It is noted that FIG. 2 shows the detailed configuration of the micro controller 8, especially, of the MPU 10 which corresponds to that shown in FIG. 7 in the case of the second embodiment.

As shown in FIG. 2, according to a level of the MPX control signal 51 derived from the initial failure testing purpose program transmitter 40, the multiplexor 18 selects either the parallel outputs of the receive register 14 or the contents on the internal bus 23. That is to say, when the MPX control signal 51 is at the logical high state, the multiplexor 18 selects the parallel outputs of the receive register 14. When the MPX control signal 51 is at the logical low state, the multiplexor 18 selects the contents of the internal bus 23.

The outputs of the multiplexor 18 are supplied to the instruction register 16 and the data register 21 and are introduced to the control circuit 17 and the data path circuit 15. Although the data register 21 is arranged outside of the data path circuit 15 for the explanation convenience as shown in FIG. 2, the data register 21 is included in the data path circuit 15.

As described hereinabove, according to the present invention, particularly in the first embodiment, the address information on the address bus of the micro controller can be transmitted externally from the micro controller 8 via the serial communication circuit 13 and the instruction codes having operands (data) and which are serially transferred from the external to the micro controller can directly be stored into the MPU controller 17 and data register 21.

Hence, when the burn-in is carried out for the bare-chip formed electronic unit mounted on the pc board, it is not necessary to install the program prepared for confirming (or evaluating) the operation of the one-chip micro controller as the initial failure test into the ROM incorporated into the one-chip micro controller 8.

Consequently, a capacity of the programmable ROM may be as minimum as necessary and the cost of assembly of the micro controller can be achieved.

In addition, in the case where the instructions are transmitted serially to the micro controller to have the micro controller 8 carry out required operations, complicated instructions such as jump instructions, branch instructions, immediate instructions including data within the instruction codes, data transfer instructions between registers or between register and memory, arithmetic operation instructions, and logical OR, AND, XOR instructions can be used.

Furthermore, since the address signal (information) on the address bus within the MPU can directly be monitored through the external testing apparatus 1B, the operating state in the MPU can be determined.

The structure to transfer the external instructions to the internal of the micro controller can be achieved by a simple circuit arrangement.

Hence, the number of the pads additionally attached to the one-chip micro controller to achieve the present invention may be less.

It is noted that the input processor 2 and the output processor 3 are exemplified by buffers disclosed in a U.S. Pat. No. 5,602,738 issued on Feb. 11, 1997 (the disclosure of which is herein incorporated by reference).

It is also noted that at least the test signal generator 50 and the initial failure testing purpose program transmitter 40 in the external initial failure testing apparatus 1B described in each of the first and second embodiments may constitute a part of a hand-held (portable) computer or a part of a personal computer, both computers of which are arranged outside of the vehicle and either computer of which is usually used for a vehicular diagnosis to determine an occurrence of failure (not initial failure) in the vehicle. In this case, the initial failure testing purpose program is inputted into the electronic unit 1A (the SCI 13) via vehicular diagnosis purpose serial communication lines that the portable computer or personal computer has.

It is finally noted that although, in each of the first and second embodiments, the initial failure testing purpose program is not executed during the application of the predetermined high bias voltage to the electronic unit 1A (i.e., during the burn-in) but is executed after the burn-in (i.e., during the application of the normal bias voltage thereto), another external program in accordance of which the electronic unit 1A and the I/O device 20 are operated may be executed during the application of the predetermined high bias voltage (i.e., during the burn-in) thereto in a case where the high voltage stress is imposed on the bare-chip mount formed electronic unit 1A in such a form as if the electronic unit 1A and I/O device 20 were actually installed in the vehicle as the vehicular control apparatus. However, this external program does not serve as the externally inputted initial failure testing purpose program but merely serves as an operation determination of the electronic unit 1A with the predetermined bias voltage applied to the electronic unit 1A via the voltage stabilizer 4. The other external program corresponds to the program shown in FIG. 8.

What is claimed is:

1. A vehicular control apparatus in combination with an external testing apparatus used for determining an initial failure of the vehicular control apparatus, comprising:

a) a vehicular electronic unit mounted on a printed circuit board in a bare-chip form and having a micro controller, the micro controller having at least a micro processing unit and a first read only memory in which a predetermined control program is stored, the micro processing unit being operated to decode instructions of the predetermined control program and to execute the instructions of the predetermined control program so as to control an object to be controlled through a vehicular actuator external to the vehicular electronic unit in a desired fashion after an initial failure test is carried out for the vehicular control apparatus and the micro controller is determined to be operated normally upon the initial failure test;

b) a high voltage bias supply arranged in the electronic unit for supplying a predetermined higher bias voltage than a normal bias voltage to the micro controller so as to impose a high stress on the micro controller under a burn-in condition;

c) an initial failure testing purpose program transmitter having a second read only memory in which an initial failure testing purpose program is stored and arranged externally to the vehicular electronic unit so as to transmit the initial failure testing purpose program to the micro controller in response to an input of a test signal;

d) a receiver mounted in the micro controller so as to receive the initial failure testing purpose program from the initial failure testing purpose program transmitter, the initial failure testing purpose program being prepared to evaluate an operation of the micro controller after the micro controller has undergone a burn-in with the high stress imposed on the micro controller;

e) a test signal generator arranged in the testing apparatus for outputting the test signal so as to start the initial failure test; and f) a first selector mounted in the micro controller which is operated in response to the input of the test signal to select instructions of the initial failure testing purpose program and output the selected instructions to the micro processing unit.

2. A method for carrying out an initial failure test to determine whether an initial failure of a micro controller of a vehicular control apparatus occurs, the method comprising the steps of:

a) applying a predetermined bias voltage higher than a normal voltage to the micro controller of the vehicular control apparatus, the micro controller being mounted on a printed circuit board in a bare-chip form and being exposed under a burn-in high temperature;

b) maintaining the application of the predetermined higher voltage supply to the micro controller for a burn-in time duration;

c) providing a test signal for an external clock signal generator to generate an external clock signal and output the external clock signal to the micro controller, the micro controller being operated on the basis of the external clock signal as its basic clock in place of an internal clock signal;

d) transmitting, responsive to the test signal, an initial failure testing purpose program to a serial communication circuit of the micro controller in synchronization with the external clock signal;

e) selecting, responsive to the test signal, instructions of the initial failure testing purpose program transmitted at the step d) in place of those of a predetermined control program in accordance with which the micro controller executes a control of an object to be controlled in a desired fashion;

f) decoding and executing the selected instructions of the initial failure testing purpose program at the step e) in synchronization with the external clock signal; and g) determining whether the initial failure occurs in the micro controller depending on whether a vehicular actuator associated with the micro controller is operated normally in response to a control signal derived from the micro controller according to contents of the selected instructions.

3. A control apparatus, comprising:

a) an electronic unit mounted on a printed circuit board in a bare-chip form, the electronic unit having a micro controller, the micro controller having a micro processing unit therein;

b) a first read only memory arranged in the micro controller and in which a predetermined control program is stored, the micro processing unit being normally operated to decode instructions of the predetermined control program and to execute the decoded instructions so as to control an object to be controlled in a desired fashion through an I/O device external to the micro controller;

c) a receiver which is so arranged in the micro controller and constructed as to receive an external testing purpose program used for evaluating an operation of the micro controller in an initial failure test for the electronic unit; and d) a first selector which is so arranged in the micro controller and constructed as to operatively select instructions of the external testing purpose program received by the receiver and output the selected instructions to the micro processing unit in place of the instructions of the predetermined control program.

4. A control apparatus as claimed in claim 3, which further comprises: e) a test signal generator arranged externally to the electronic unit for generating and outputting a test signal to the first selector so as to select the instructions of the testing purpose program and to output the selected instructions to the micro processing unit; f) an external clock signal generator which is so arranged externally to the electronic unit and constructed as to generate an external clock signal; f) an internal clock signal generator which is so arranged in the electronic unit and constructed as to generate and output an internal clock signal to the micro controller so that the execution of the micro controller for one machine cycle is normally based on the internal clock signal during the control of the micro controller for the object to be controlled in accordance with the predetermined control program; and g) a second selector which is operated in response to the input of the test signal derived from the external test signal generator to select the external clock signal from the external clock signal generator and output the external clock signal to the micro controller so that the execution of the micro controller for one machine cycle is, in turn, based on the external clock signal during the initial failure test on the operation of the micro controller in accordance with the testing purpose program.

5. A control apparatus as claimed in claim 4, which further comprises an external testing purpose program transmitter having a second read only memory in which the testing purpose program is stored, the external testing purpose program transmitter transmitting the instructions of the external testing purpose program in response to an input of the test signal from the external test signal generator serially to the receiver in synchronization with the external clock signal.

6. A control apparatus as claimed in claim 5, which further comprises a voltage stabilizer connected to a DC power supply so as to supply a stabilized voltage to the micro controller as a bias voltage, the voltage stabilizer supplying a predetermined high voltage to the micro controller so as to impose a high stress on the micro controller under a burn-in condition such that the micro controller is exposed to a burn-in temperature for a burn-in time duration.

7. A control apparatus as claimed in claim 6, wherein the receiver comprises a serial communication circuit having a receive register having m number of bits corresponding to each length of the instructions of the external test purpose program.

8. A control apparatus as claimed in claim 7, wherein the first selector comprises a first multiplexor having a plurality of first AND circuits (AND3), first invertors (INV4), second AND circuits (AND4), and first OR circuits (OR2), a pull down resistor (R1), and a second inverter (INV5), one of two input ends of each first AND circuit being connected to a corresponding bit position of the receive register, one of two input ends of each second AND circuit being connected to a corresponding bit position of an internal bus of the microcomputer, an input end of each first invertor being connected to the other input end of each second AND circuit, an output end of each first inverter being connected to the other input end of each first AND circuit, each output end of both of each first and second AND circuits being connected to a corresponding one of the first OR circuits, and an input end of the first multiplexor being arranged to receive the test signal derived from the external test signal generator, being connected across the pull down resistor, and being connected to the other input end of each second AND circuit via the second invertor.

9. A control apparatus as claimed in claim 8, wherein an internal bus of the micro controller is connected to an Input/Output port of the micro controller, the first read only memory of the micro controller, a random access memory of the micro controller, a data path circuit of the micro controller, and the first selector.

10. A control apparatus as claimed in claim 9, wherein the first multiplexor is connected to an instruction register arranged in the micro processing unit and to a data register arranged in the micro processing unit.

11. A control apparatus as claimed in claim 10, wherein the second selector comprises a second multiplexor having a first AND circuit (AND1), an invertor (INV3), a second AND circuit (AND2), and an OR circuit (OR1), one of two input ends of the first AND circuit being connected to an output end of the internal clock signal generator, one of two input ends of the second AND circuit being connected to an output end of the external clock generator, the other input end of the first AND circuit being connected to the other input end of the second AND circuit via the invertor, the other input end of the second AND circuit being connected to the output end of the external test signal generator connected across the pull down resistor (R1), and each output end of the first and second AND circuits being connected to the OR circuit whose output end is connected to the micro processing unit.

12. A control apparatus as claimed in claim 11, which further comprises an input processor connected to the Input/Output port of the micro controller and an output processor connected to the Input/Output port and wherein the I/O device comprises a vehicular actuator, connected to the output processor, for actuating a vehicular actuatedly operable part in response to a drive signal derived from the output processor and a sensor, connected to the input processor, for detecting a variable correlated to a result of the actuation of the vehicular actuatedly operable part.

13. A control apparatus as claimed in claim 12, wherein the voltage stabilizer and the input and output processors are mounted on the same printed circuit board as the micro controller.

14. A control apparatus as claimed in claim 13, wherein the serial communication circuit further comprises a transmit register having the m bits connected to the data path circuit of the micro processing unit, an address decoder, the read only memory of the microcomputer, and the random access memory of the microcomputer for transmitting data of the data pass serially to the external testing purpose program transmitter in synchronization with the external clock signal so as to send a result of the initial failure test using the external testing purpose program to the external testing purpose program transmitter.

15. A control apparatus as claimed in claim 14, wherein the predetermined high voltage supplied by the voltage stabilizer to the micro controller is approximately 7 volts.

16. A control apparatus as claimed in claim 15, wherein the first read only memory comprises a mask ROM.

* * * * *